(12) United States Patent
Ye

(10) Patent No.: US 10,444,885 B2
(45) Date of Patent: Oct. 15, 2019

(54) TOUCH SCREEN AND DISPLAY PANEL

(71) Applicant: Wuhan China Star Optoelectronics Semiconductor Display Technology Co., Ltd., Wuhan, Hubei (CN)

(72) Inventor: Jian Ye, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 36 days.

(21) Appl. No.: 15/922,338

(22) Filed: Mar. 15, 2018

(65) Prior Publication Data

US 2019/0187845 A1 Jun. 20, 2019

Related U.S. Application Data

(63) Continuation of application No. PCT/CN2018/072072, filed on Jan. 10, 2018.

(30) Foreign Application Priority Data

Dec. 14, 2017 (CN) .......................... 2017 1 1342707

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *H01L 27/323* (2013.01)

(58) Field of Classification Search
CPC ............ G06F 3/02; G06F 3/041; G06F 3/045; G09G 5/00; G01R 27/26
See application file for complete search history.

(56) References Cited

U.S. PATENT DOCUMENTS 8,917,252 B2 * 12/2014 Kuriki .................... G06F 3/044
345/173
8,994,682 B2 * 3/2015 Hashimoto ........... G06F 3/0418
345/173

(Continued)

FOREIGN PATENT DOCUMENTS

CN 105138210 A 12/2015
CN 105320372 A 2/2016

(Continued)

*Primary Examiner* — Pegeman Karimi
(74) *Attorney, Agent, or Firm* — Hauptman Ham, LLP

(57) ABSTRACT

A touch screen and a display panel are provided. The touch screen includes a substrate, a first conductive layer disposed on a surface of the substrate and including a first metal electrode and a second metal electrode insulated from the first metal electrode, the second metal electrode including two first sub-patterns respectively disposed at two sides of the first metal electrode; an insulating layer disposed on the first conductive layer; a second conductive layer disposed on the first conductive layer and the insulating layer, including a third metal electrode, and the third metal electrode is connected to the two first sub-patterns through the insulating layer; wherein the first metal electrode and one of the two first sub-patterns of the second metal electrode form a touch driving electrode, and the first metal electrode and another of the two first sub-patterns of the second metal electrode form a touch sensing electrode.

20 Claims, 3 Drawing Sheets

(56) References Cited

U.S. PATENT DOCUMENTS

| | | | | |
|---|---|---|---|---|
| 9,280,244 B2 * | 3/2016 | Lee | ............... | G06F 3/044 |
| 2009/0213090 A1 * | 8/2009 | Mamba | ............ | G06F 3/044 |
| | | | | 345/174 |
| 2013/0257786 A1 * | 10/2013 | Brown | ............ | G06F 3/044 |
| | | | | 345/174 |

FOREIGN PATENT DOCUMENTS

| | | |
|---|---|---|
| CN | 106547407 A | 3/2017 |
| CN | 106873835 A | 6/2017 |
| CN | 206489537 U | 9/2017 |

\* cited by examiner

TOUCH SCREEN AND DISPLAY PANEL

RELATED APPLICATIONS

The present application is a continuation application of PCT Patent Application No. PCT/CN2018/072072, filed Jan. 10, 2018, which claims the priority benefit of Chinese Patent Application No. 201711342707.0, filed Dec. 14, 2017, which is herein incorporated by reference in its entirety.

FIELD OF THE DISCLOSURE

The disclosure relates to a display panel technical field, and more particularly to a touch screen and a display panel.

BACKGROUND

With the rapid development of the flexible organic light emitting diode (OLED) display technology, the touch screen required to be flexible and foldable to be compatible with, the traditional touch screen is made of indium tin oxide (ITO) material, but ITO is a brittle metal oxide material, which can no longer meet the requirements of flexible touch screen.

Metal mesh due to good flexibility is ideal for flexible touch screen. The conductive bridge connection is applied on the traditional metal mesh touch screen, the conductive material area of the conductive bridge connection occupies the entire electrode area of about 5% to 10%, so the contact areas of the conductive bridge at both ends are small, high connection impedance or open circuit risk are easily occurred.

SUMMARY

A technical problem to be solved by the disclosure is to provide a touch screen and a display panel, so the problem of high impedance and open circuit could be effectively avoided.

To achieve the above object, according to one aspect, the embodiment of the disclosure provides a touch screen including: a substrate, a first conductive layer disposed on a surface of the substrate and including a first metal electrode and a second metal electrode insulated from the first metal electrode, the second metal electrode including two first sub-patterns respectively disposed at two sides of the first metal electrode; an insulating layer disposed on the first conductive layer; a second conductive layer disposed on the first conductive layer and the insulating layer, and including a third metal electrode, wherein the third metal electrode is connected to the at least two of first sub-patterns through the insulating layer; wherein the first metal electrode and one of the two first sub-patterns of the second metal electrode form a touch driving electrode, and the first metal electrode and another of the two first sub-patterns of the second metal electrode form a touch sensing electrode; wherein the first metal electrode includes at least two second sub-patterns arranged along a first direction, and the at least two second sub-patterns are connected to each other; wherein the second metal electrode includes the at least two first sub-patterns arranged along a second direction, the at least two first sub-patterns are respectively disposed at the two sides of the first metal electrode, and the at least two first sub-patterns and the at least two second sub-patterns are arranged alternately; wherein the third metal electrode includes at least two third sub-patterns arranged along the second direction, the at least two third sub-patterns are respectively disposed corresponding to the at least two first sub-patterns; wherein the first conductive layer and the second conductive layer are patterned to form a metal mesh; wherein the first conductive layer includes three metal layers, the three metal layers are sequentially a titanium layer, an aluminum layer and a titanium layer; wherein the second conductive layer includes three metal layers, the three metal layers are sequentially a titanium layer, an aluminum layer and a titanium layer.

To achieve the above object, according to another aspect, the embodiment of the disclosure provides a touch screen including: a substrate, a first conductive layer disposed on a surface of the substrate and including a first metal electrode and a second metal electrode insulated from the first metal electrode, the second metal electrode including two first sub-patterns respectively disposed at two sides of the first metal electrode; an insulating layer disposed on the first conductive layer; a second conductive layer disposed on the first conductive layer and the insulating layer, including a third metal electrode connected to the at least two of first sub-patterns through the insulating layer; wherein the first metal electrode and one of the two first sub-patterns of the second metal electrode form a touch driving electrode, and the first metal electrode and another of the two first sub-patterns of the second metal electrode form a touch sensing electrode.

To achieve the above object, according to another aspect, the embodiment of the disclosure provides a display panel including the above-mentioned touch screen.

The beneficial effects of the disclosure are as follows: compare with the prior art, in the disclosure, the third metal electrode and the second metal electrode are in full contact with each other via two third sub-patterns of the third metal electrode through the insulating layer. The combination of the third sub-patterns and the second metal electrode is insulated from the first metal electrode by the insulating layer, since the third metal electrode is in full contact with the second metal electrode, the contact area of the metal is increased, the impedance and the risk of open circuit could be effectively reduced.

DETAILED DESCRIPTION OF PREFERRED EMBODIMENTS

In order to illustrate a technical solution according to embodiments of the disclosure more clearly, drawings to be used in the description of the embodiments will be briefly set forth in the following. It is obvious that the drawings in the following description are only related to some embodiments of the disclosure. Those ordinarily skilled in the art may obtain other embodiments according to these drawings, without any inventive work.

Figure 1:
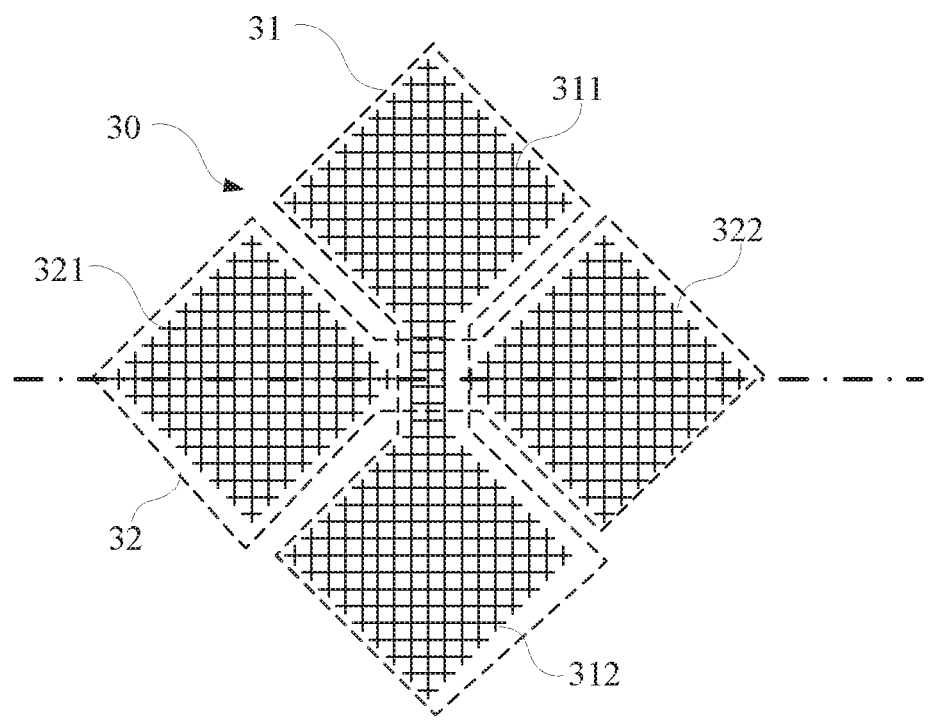
FIG. 1 is a schematic top view of a first conductive layer of a touch screen according to an embodiment of the disclosure.

Please refer to FIG. 1, FIG. 1 is a schematic top view of a first conductive layer of a touch screen according to an embodiment of the disclosure. As shown in FIG. 1, the first conductive layer 30 includes a first metal electrode 31 and a second metal electrode 32. The first metal electrode 31 includes two second sub-patterns 311, 312 arranged along a vertical direction, and the two second sub-patterns 311, 312 are connected to each other. The second metal electrode 32 includes two first sub-patterns 321, 322 respectively disposed at two sides of the first metal electrode 31 and arranged along a horizontal direction.

In some embodiment, the first metal electrode 31 is not necessarily two patterns as shown in FIG. 1, the first metal electrode may also be divided into two parts according to the connection of the first sub-patterns 321, 322, one of the two parts is similar to the second sub-pattern 311, and another of the two parts is similar to the second sub-pattern 312.

In some embodiment, the second sub-patterns 311, 312 and the first sub-patterns 321, 322 are not necessarily arranged along the vertical and horizontal directions, as long as the arranged directions are perpendicular to each other. Even the arranged direction of the second sub-patterns 311, 312 and the arranged direction of the first sub-patterns 321, 322 are not necessarily perpendicular to each other but only need to have an included angle, as long as the second sub-patterns 311, 312 do not overlap the first sub-patterns 321, 322.

In this embodiment, the second sub-patterns 311, 312 and the first sub-patterns 321, 322 are diamond-shaped metal mesh, the metal mesh is formed by patterning a metal layer coated on a substrate. In some embodiment, the second sub-patterns 311, 312 and the first sub-patterns 321, 322 are not necessarily the diamond-shaped metal mesh as shown in FIG. 1, also could be round, triangular, oval, or even irregular patterns, and could be a metal sheet, or a sheet of metal with openings.

Figure 2:
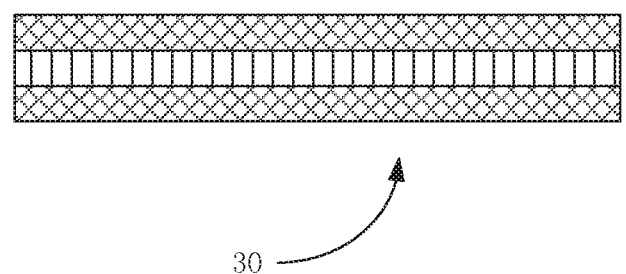
FIG. 2 is a structural schematic view of a material of a first conductive layer of a touch screen according to an embodiment of the disclosure.

Please refer to FIG. 2 together, FIG. 2 is a structural schematic view of a material of a first conductive layer of a touch screen according to an embodiment of the disclosure, the first conductive layer 30 includes three metal layers, the three metal layers are sequentially a titanium layer, an aluminum layer and a titanium layer. In some embodiment, the material of the three metal layers of the first conductive layer may also be made of other soft and flexible metal materials.

Through the above description, the disclosure achieves the purpose of flexible bending by adopting a metal mesh.

Figure 3:
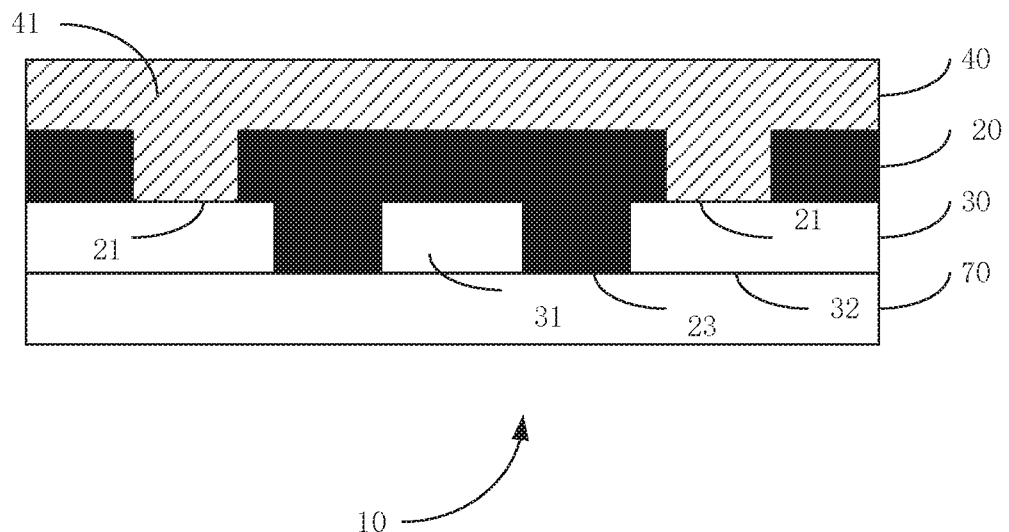
FIG. 3 is a schematic sectional view of a touch screen according to the first embodiment of the disclosure.

Please refer to FIG. 3, FIG. 3 is a schematic sectional view of a touch screen according to the first embodiment of the disclosure. The touch screen 10 provided by the disclosure includes a substrate 70, a first conductive layer 30 disposed on a surface of the substrate 70, an insulating layer 20 and a second conductive layer 40 disposed on the first conductive layer 30. The first conductive layer 30 includes a first metal electrode 31 and a second metal electrode 32. The second conductive layer 40 includes a third metal electrode 41. An opening 21 is disposed on the insulating layer 20, the second conductive layer 40 is connected to the first conductive layer 30 through the opening 21. The opening 21 is disposed near an intersection formed by a connection between the two second sub-patterns 321, 322 and the first metal electrode 31. The insulating layer 20 forms an insulating bridge 23 through the opening 21.

Figure 4:
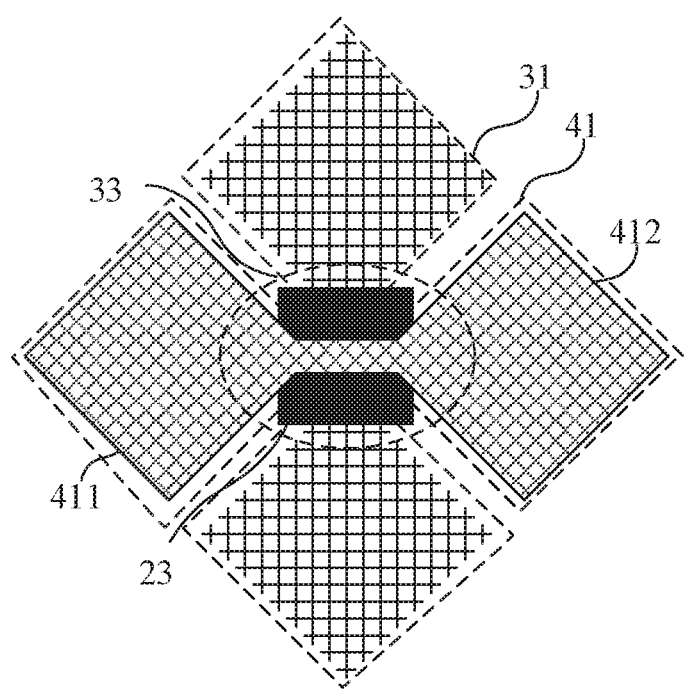
FIG. 4 is a schematic top view of a touch screen according to the first embodiment of the disclosure.

Please refer to FIG. 4 together, FIG. 4 is a schematic top view of a touch screen according to the first embodiment of the disclosure. The structure of the first conductive layer 30 is the same as that shown in FIG. 1, and details are not described herein. The insulating bridge 23 is disposed at an intersection 33 formed by a connection between the two first sub-patterns 321, 322 and the first metal electrode 31. The third metal electrode 41 includes two third sub-patterns 411, 412 respectively disposed over the two first sub-patterns 321, 322. The third sub-pattern 411 is disposed over the first sub-pattern 321 and connected to the first sub-pattern 321 through the opening 21, the third sub-pattern 412 is disposed over the first sub-pattern 322 and connected to the first sub-pattern 322 through the opening 21. The two first sub-patterns 321, 322 and the two third sub-patterns 411, 412 are made of metal material, so the third metal electrode 41 and the second metal electrode 32 are connected. The two third sub-patterns 411, 412 are connected through the insulating bridge 23. The third metal electrode 41 is separated from the first metal electrode 31 by the insulating bridge 23, so insulated from each other. The second metal electrode 32 is separated from the first metal electrode 31 and insulated from each other, so the first metal electrode 31 and one of the two first sub-patterns 321 or 322 of the second metal electrode 32 form a touch driving electrode, and the first metal electrode 31 and another of the two first sub-patterns 321 or 322 of the second metal electrode 32 form a touch sensing electrode.

In this embodiment, the two third sub-patterns 411, 412 and the two first sub-patterns 321 or 322 are diamond-shaped metal mesh with the same shape and the same size, the metal mesh is formed by patterning a metal layer coated on a substrate.

Figure 5:
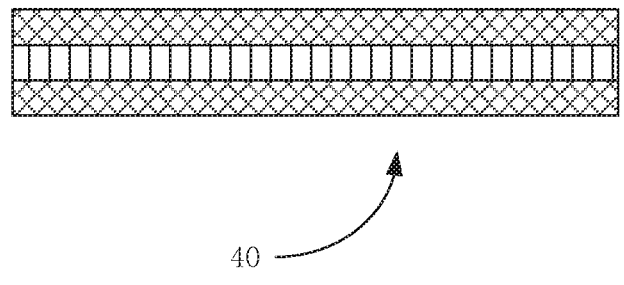
FIG. 5 is a structural schematic view of a material of a second conductive layer of a touch screen according to an embodiment of the disclosure.

Please refer to FIG. 5 together, FIG. 5 is a structural schematic view of a material of a second conductive layer of a touch screen according to an embodiment of the disclosure, the second conductive layer 40 includes three metal layers, the three metal layers are sequentially a titanium layer, an aluminum layer and a titanium layer. In some embodiment, the material of the three metal layers of the second conductive layer may also be made of other soft and flexible metal materials.

In some embodiment, the third sub-patterns 411, 412 and the second sub-patterns 321, 322 need not be the same in shape and size, as long as a distribution area of the third metal electrode 41 is not exceeded a distribution area of the second metal electrode 32. The third sub-patterns 411, 412 are not necessarily the metal mesh, also could be a metal sheet, or a sheet of metal with openings.

In some embodiment, the third metal electrode 41 need not necessarily be composed of two metal meshes connected to each other, but may be a unitary body, such as a rectangle, an ellipse, or other shapes, just needs to ensure that the third metal electrode 41 is insulated from the first metal electrode 31 and is in contact with the two first sub-patterns 321, 322 of the second metal electrode 32.

Through the above description, the disclosure enlarges the conductive contact area by adopting the whole surface contact of the third sub-patterns and the first sub-patterns, so the impedance and the risk of open circuit could be effectively reduced.

Figure 6:
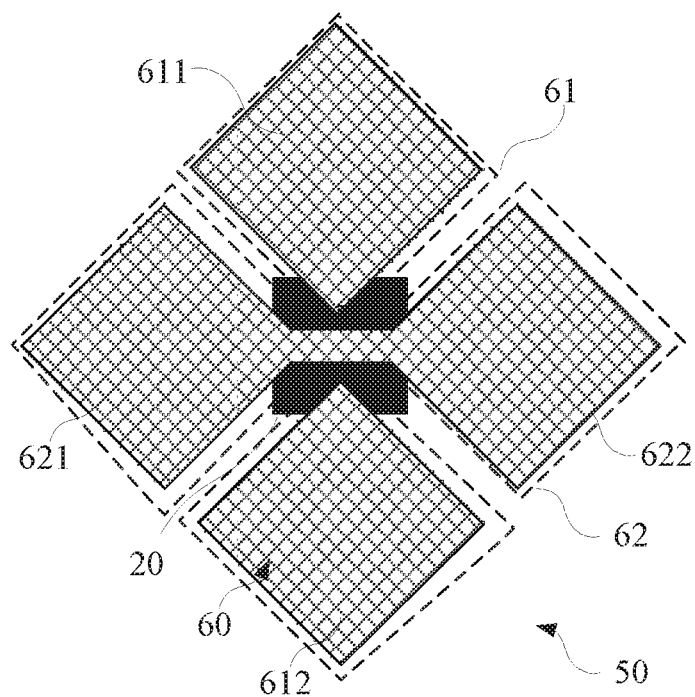
FIG. 6 is a schematic top view of a touch screen according to the second embodiment of the disclosure.

Please refer to FIG. 6, FIG. 6 is a schematic top view of a touch screen according to the second embodiment of the disclosure. The touch screen 50 includes the first conductive layer 30, the insulating layer 20 and a second conductive layer 60, the structure of the first conductive layer 30 is the same as that of the first conductive layer shown in FIG. 1, and details are not described herein. The arrangement of the insulating layer 20 is the same as that described in FIG. 3, and details are not described herein. The second conductive layer 60 includes a third metal electrode 61 and a fourth metal electrode 62, the third metal electrode 61 includes two third sub-patterns 611, 612, the two third sub-patterns 611, 612 are connected through the insulating layer 20. The fourth metal electrode 62 includes two fourth sub-patterns 621, 622 respectively disposed at two sides of the third metal electrode 61, and not connected to the third metal electrode 61.

The two third sub-patterns 611, 612 are respectively disposed corresponding to the at least two first sub-patterns 321, 322, and the two fourth sub-patterns 621, 622 are respectively disposed corresponding to the at least two second sub-patterns 311, 312, so the combination of the third metal electrode 61 and the second metal electrode 32 and the combination of the fourth metal electrode 62 and the first metal electrode 31 form a touch capacitance, the two first sub-patterns 321, 322 respectively form a touch sensing electrode and a touch driving electrode of the touch capacitance.

In this embodiment, the two third sub-patterns 611, 612 and the two first sub-patterns 321 or 322 are diamond-shaped metal mesh with the same shape and the same size, the metal mesh is formed by patterning a metal layer coated on a substrate. In some embodiment, the shapes of the two third sub-patterns 611, 612 and the two first sub-patterns 321, 322 need not be exactly the same, and may be circular, triangular, or arbitrary shapes, the size of the two third sub-patterns 611, 612 may be less than or equal to the two first sub-patterns 321, 322, as long as a distribution area of the third metal electrode 61 is not exceeded a distribution area of the second metal electrode 32. The third sub-patterns 611, 612 are not necessarily the metal mesh, also could be a metal sheet, or a sheet of metal with openings. Similarly, the shapes of the two fourth sub-patterns 621, 622 and the two second sub-patterns 311, 312 need not be exactly the same, and may be circular, triangular, or arbitrary shapes, the size of the two fourth sub-patterns 621, 622 may be less than or equal to the two second sub-patterns 311, 312, as long as a distribution area of the fourth metal electrode 62 is not exceeded a distribution area of the first metal electrode 31. The fourth sub-patterns 621, 622 are not necessarily the metal mesh, also could be a metal sheet, or a sheet of metal with openings.

Through the above description, the disclosure enlarges the conductive contact area by adopting the whole surface contact of the third sub-patterns and the first sub-patterns, so the impedance and the risk of open circuit could be effectively reduced. Meanwhile, the fourth sub-patterns in contact with the entire surface of the first sub-patterns are added to reduce the impedance and balance the RC delay in the circuit.

Figure 7:
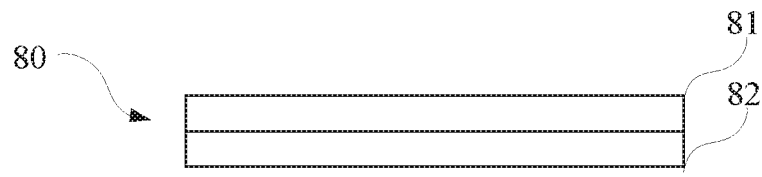
FIG. 7 is a structural schematic view of a display panel according to an embodiment of the disclosure.

Please refer to FIG. 7, FIG. 7 is a structural schematic view of a display panel according to an embodiment of the disclosure. The display panel 80 includes a display screen 82 and a touch screen 81, the touch screen 81 is a flexible touch screen, the display screen 82 is a flexible display screen, the structure of the touch screen 81 is as shown in FIG. 3 or FIG. 4.

Through the above description, the disclosure is not easily broken or open-circuit occurred when bending the touch screen using a metal mesh, the metal mesh in the second conductive layer contacts the entire surface of the metal mesh in the first conductive layer to enlarge the conductive contact area, so the impedance and the risk of open circuit could be effectively reduced.

Compare with the prior art using conductive bridge connection, in the disclosure, the second metal electrode on the first conductive layer is entirely in contact with the metal mesh to connect the two first sub-patterns of the second metal electrode, the whole surface contact could effectively reduce the impedance and the risk of open circuit.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:
1. A touch screen, comprising
   a substrate;
   a first conductive layer, the first conductive layer disposed on a surface of the substrate, comprising a first metal electrode and a second metal electrode insulated from the first metal electrode, wherein the second metal electrode includes two first sub-patterns respectively disposed at two sides of the first metal electrode;
   an insulating layer, disposed on the first conductive layer; and
   a second conductive layer, the second conductive layer disposed on the first conductive layer and the insulating layer, comprising a third metal electrode, wherein the third metal electrode is connected to the at least two of first sub-patterns through the insulating layer;
   wherein the first metal electrode and one of the two first sub-patterns of the second metal electrode form a touch driving electrode, and the first metal electrode and another of the two first sub-patterns of the second metal electrode form a touch sensing electrode;
   wherein the first metal electrode includes at least two second sub-patterns arranged along a first direction, and the at least two second sub-patterns are connected to each other;
   wherein the second metal electrode includes the at least two first sub-patterns arranged along a second direction, the at least two first sub-patterns are respectively disposed at the two sides of the first metal electrode, and the at least two first sub-patterns and the at least two second sub-patterns are arranged alternately;
   wherein the third metal electrode includes at least two third sub-patterns arranged along the second direction, the at least two third sub-patterns are respectively disposed corresponding to the at least two first sub-patterns;
   wherein the first conductive layer and the second conductive layer are patterned to form a metal mesh;
   wherein the first conductive layer includes three metal layers, the three metal layers are sequentially a titanium layer, an aluminum layer and a titanium layer;
   wherein the second conductive layer includes three metal layers, the three metal layers are sequentially a titanium layer, an aluminum layer and a titanium layer.
2. The touch screen according to claim 1, wherein the second conductive layer further comprises a fourth metal electrode disposed on the first metal electrode, the fourth metal electrode is insulated from the third electrode, and the fourth metal electrode includes two fourth sub-patterns respectively disposed at two sides of the third metal electrode;
  wherein the first metal electrode and one of the two fourth sub-patterns of the fourth metal electrode form a touch driving electrode, and the first metal electrode and another of the two fourth sub-patterns of the fourth metal electrode form a touch sensing electrode.

3. A touch screen, comprising
  a substrate;
  a first conductive layer, the first conductive layer disposed on a surface of the substrate, comprising a first metal electrode and a second metal electrode insulated from the first metal electrode, wherein the second metal electrode includes two first sub-patterns respectively disposed at two sides of the first metal electrode;
  an insulating layer, disposed on the first conductive layer; and
  a second conductive layer the second conductive layer disposed on the first conductive layer and the insulating layer, comprising a third metal electrode, wherein the third metal electrode is connected to the at least two of first sub-patterns through the insulating layer;
  wherein the first metal electrode and one of the two first sub-patterns of the second metal electrode form a touch driving electrode, and the first metal electrode and another of the two first sub-patterns of the second metal electrode form a touch sensing electrode.

4. The touch screen according to claim 3, wherein the first metal electrode includes at least two second sub-patterns arranged along a first direction, and the at least two second sub-patterns are connected to each other;
  wherein the second metal electrode includes the at least two first sub-patterns arranged along a second direction, the at least two first sub-patterns are respectively disposed at the two sides of the first metal electrode, and the at least two first sub-patterns and the at least two second sub-patterns are arranged alternately;
  wherein the third metal electrode includes at least two third sub-patterns arranged along the second direction, the at least two third sub-patterns are respectively disposed corresponding to the at least two first sub-patterns;
  wherein the first conductive layer and the second conductive layer are patterned to form a metal mesh.

5. The touch screen according to claim 4, wherein the second conductive layer further comprises a fourth metal electrode disposed on the first metal electrode, the fourth metal electrode is insulated from the third electrode, and the fourth metal electrode includes two fourth sub-patterns respectively disposed at two sides of the third metal electrode;
  wherein the first metal electrode and one of the two fourth sub-patterns of the fourth metal electrode form a touch driving electrode, and the first metal electrode and another of the two fourth sub-patterns of the fourth metal electrode form a touch sensing electrode.

6. The touch screen according to claim 5, wherein the fourth metal electrode includes the at least two fourth sub-patterns arranged along the first direction, and the at least two fourth sub-patterns are respectively disposed at the two sides of the third metal electrode.

7. The touch screen according to claim 6, wherein a distribution area of the third metal electrode is not exceeded a distribution area of the second metal electrode, and a distribution area of the fourth metal electrode is not exceeded a distribution area of the first metal electrode.

8. The touch screen according to claim 7, wherein a metal pattern disposed corresponding to the first conductive layer and the second conductive layer includes the metal mesh, and the shape and the size of the metal mesh are consistent.

9. The touch screen according to claim 4, wherein a connection between the two first sub-patterns and the first metal electrode form an intersection, the insulating layer is disposed at the intersection of the first metal electrode;
  wherein the first direction is perpendicular to the second direction.

10. The touch screen according to claim 3, wherein the first conductive layer includes three metal layers, the three metal layers are sequentially a titanium layer, an aluminum layer and a titanium layer;
  wherein the second conductive layer includes three metal layers, the three metal layers are sequentially a titanium layer, an aluminum layer and a titanium layer.

11. The touch screen according to claim 3, wherein the touch screen is a flexible touch screen.

12. A display panel, comprising at least a touch screen, wherein the touch screen comprises:
  a substrate;
  a first conductive layer, the first conductive layer disposed on a surface of the substrate, comprising a first metal electrode and a second metal electrode insulated from the first metal electrode, wherein the second metal electrode includes two first sub-patterns respectively disposed at two sides of the first metal electrode;
  an insulating layer, disposed on the first conductive layer; and
  a second conductive layer, the second conductive layer disposed on the first conductive layer and the insulating layer, comprising a third metal electrode, wherein the third metal electrode is connected to the at least two of first sub-patterns through the insulating layer;
  wherein the first metal electrode and one of the two first sub-patterns of the second metal electrode form a touch driving electrode, and the first metal electrode and another of the two first sub-patterns of the second metal electrode form a touch sensing electrode.

13. The display panel according to claim 12, wherein the first metal electrode includes at least two second sub-patterns arranged along a first direction, and the at least two second sub-patterns are connected to each other;
  wherein the second metal electrode includes the at least two first sub-patterns arranged along a second direction, the at least two first sub-patterns are respectively disposed at the two sides of the first metal electrode, and the at least two first sub-patterns and the at least two second sub-patterns are arranged alternately;
  wherein the third metal electrode includes at least two third sub-patterns arranged along the second direction, the at least two third sub-patterns are respectively disposed corresponding to the at least two first sub-patterns;
  wherein the first conductive layer and the second conductive layer are patterned to form a metal mesh.

14. The display panel according to claim 13, wherein the second conductive layer further comprises a fourth metal electrode disposed on the first metal electrode, the fourth metal electrode is insulated from the third electrode, and the fourth metal electrode includes two fourth sub-patterns respectively disposed at two sides of the third metal electrode;
  wherein the first metal electrode and one of the two fourth sub-patterns of the fourth metal electrode form a touch driving electrode, and the first metal electrode and another of the two fourth sub-patterns of the fourth metal electrode form a touch sensing electrode.

15. The display panel according to claim 14, wherein the fourth metal electrode includes the at least two fourth sub-patterns arranged along the first direction, and the at least two fourth sub-patterns are respectively disposed at the two sides of the third metal electrode.

16. The display panel according to claim 15, wherein a distribution area of the third metal electrode is not exceeded a distribution area of the second metal electrode, and a distribution area of the fourth metal electrode is not exceeded a distribution area of the first metal electrode.

17. The display panel according to claim 13, wherein a connection between the two first sub-patterns and the first metal electrode form an intersection, the insulating layer is disposed at the intersection of the first metal electrode;

wherein the first direction is perpendicular to the second direction.

18. The display panel according to claim 12, wherein a metal pattern disposed corresponding to the first conductive layer and the second conductive layer includes the metal mesh, and the shape and the size of the metal mesh are consistent.

19. The display panel according to claim 12, wherein the first conductive layer includes three metal layers, the three metal layers are sequentially a titanium layer, an aluminum layer and a titanium layer;

wherein the second conductive layer includes three metal layers the three metal layers are sequentially a titanium layer, an aluminum layer and a titanium layer.

20. The display panel according to claim 12, wherein the touch screen is a flexible touch screen.

* * * * *